(12) United States Patent
Zhao et al.

(10) Patent No.: US 8,718,550 B2
(45) Date of Patent: May 6, 2014

(54) INTERPOSER PACKAGE STRUCTURE FOR WIRELESS COMMUNICATION ELEMENT, THERMAL ENHANCEMENT, AND EMI SHIELDING

(75) Inventors: Sam Ziqun Zhao, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 154 days.

(21) Appl. No.: 13/247,543

(22) Filed: Sep. 28, 2011

(65) Prior Publication Data

US 2013/0078915 A1  Mar. 28, 2013

(51) Int. Cl.
*H04B 5/00* (2006.01)

(52) U.S. Cl.
USPC ... 455/41.1; 455/41.2; 455/556.1; 455/575.5; 257/532; 257/659; 257/686; 438/106; 438/127

(58) Field of Classification Search
USPC .......... 455/41.1, 41.2, 556.1, 575.5; 257/659, 257/532, 522, 668, 669, 686, 783, 723, 678, 257/690; 439/66; 438/106, 127, 109, 113
See application file for complete search history.

(56) References Cited

U.S. PATENT DOCUMENTS

| | | | | |
|---|---|---|---|---|
| 6,266,872 B1 * | 7/2001 | Fjelstad | ........................... | 29/832 |
| 7,084,489 B2 * | 8/2006 | Thurgood | .................... | 257/669 |
| 7,288,835 B2 * | 10/2007 | Yim et al. | ...................... | 257/685 |
| 7,385,299 B2 * | 6/2008 | Chow et al. | ................... | 257/787 |
| 7,411,281 B2 * | 8/2008 | Zhang | ........................... | 257/678 |
| 7,432,586 B2 * | 10/2008 | Zhao et al. | ..................... | 257/685 |
| 7,579,215 B2 * | 8/2009 | Swirbel | ........................ | 438/113 |
| 7,618,849 B2 * | 11/2009 | Khan et al. | ..................... | 438/127 |
| 7,714,453 B2 * | 5/2010 | Khan et al. | ..................... | 257/787 |
| 7,852,634 B2 * | 12/2010 | Sakamoto et al. | ............ | 361/761 |
| 7,893,360 B2 * | 2/2011 | Sakamoto et al. | ............ | 174/260 |
| 7,901,987 B2 * | 3/2011 | Yang et al. | ...................... | 438/109 |
| 8,049,320 B2 * | 11/2011 | Harper et al. | ................. | 257/686 |
| 8,057,241 B2 * | 11/2011 | Tamura | ........................... | 439/66 |
| 8,084,840 B2 * | 12/2011 | Kim et al. | ...................... | 257/522 |
| 8,169,058 B2 * | 5/2012 | Pagaila et al. | ................. | 257/629 |
| 8,169,067 B2 * | 5/2012 | Law et al. | ...................... | 257/690 |
| 8,183,687 B2 * | 5/2012 | Khan et al. | ..................... | 257/723 |
| 8,269,323 B2 * | 9/2012 | Khan et al. | ..................... | 257/675 |
| 8,378,476 B2 * | 2/2013 | Lee et al. | ....................... | 257/686 |
| 8,406,004 B2 * | 3/2013 | Pagaila et al. | ................. | 361/760 |
| 8,409,920 B2 * | 4/2013 | Pendse et al. | ................. | 438/109 |
| 8,421,203 B2 * | 4/2013 | Chi et al. | ....................... | 257/687 |
| 2004/0178499 A1 | 9/2004 | Mistry et al. | | |
| 2006/0043559 A1 | 3/2006 | Chow et al. | | |
| 2007/0290376 A1 | 12/2007 | Zhao et al. | | |
| 2008/0128882 A1 * | 6/2008 | Baek et al. | ..................... | 257/686 |
| 2008/0211089 A1 | 9/2008 | Khan et al. | | |

\* cited by examiner

*Primary Examiner* — Marceau Milord
(74) *Attorney, Agent, or Firm* — Sterne, Kessler, Goldstein & Fox P.L.L.C.

(57) ABSTRACT

Embodiments of an interposer package structure are provided herein. Embodiments include a substrate having first and second opposing surfaces. An IC die electrically coupled to the first surface of the substrate. A plurality of contact members coupled to the first surface of the substrate. An interposer having a plurality of contact elements located on a first surface. Each conductive element coupled to a respective one of the plurality of contact members. The interposer is configured to facilitate wireless communication between the IC die and another device, heat spreading and electromagnetic interference shielding.

26 Claims, 12 Drawing Sheets

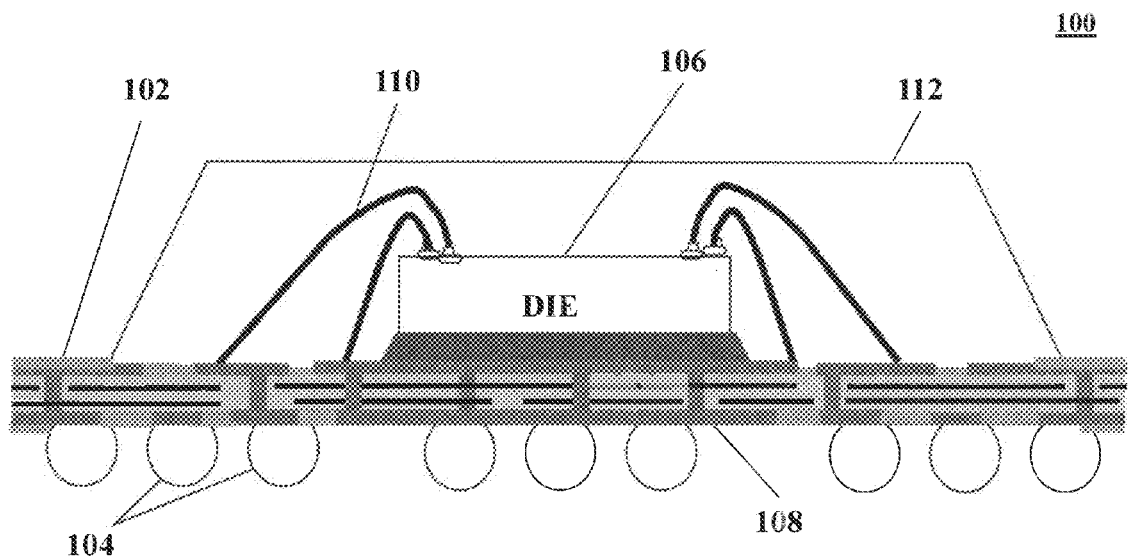
FIG. 1
(Conventional)
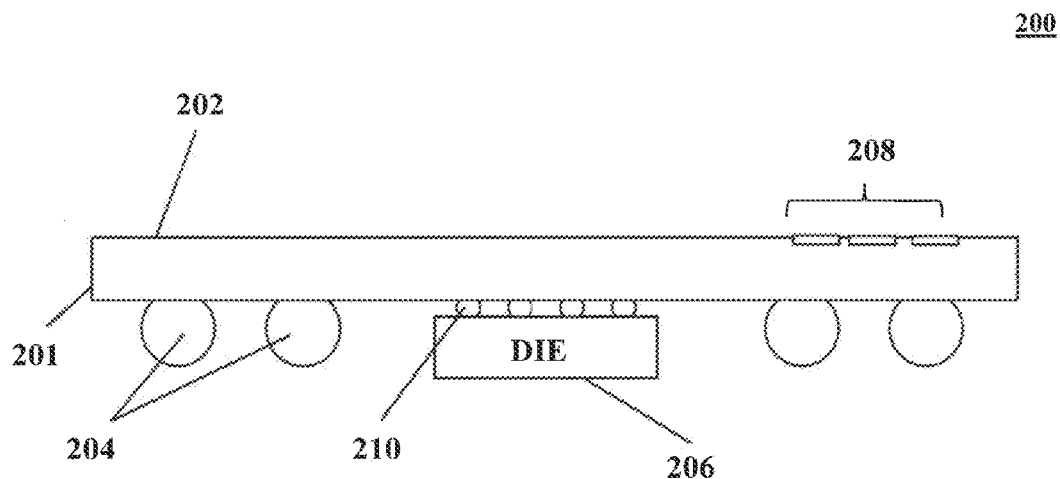
FIG. 2
(Conventional)

INTERPOSER PACKAGE STRUCTURE FOR WIRELESS COMMUNICATION ELEMENT, THERMAL ENHANCEMENT, AND EMI SHIELDING

FIELD

Embodiments described herein generally relate to semiconductor devices, and more particularly to the field of integrated circuit (IC) packaging.

BACKGROUND

The semiconductor industry has experienced a rapid growth in the area of integrated circuits (ICs). Advancements in microelectronics related to wireless communication devices have been a driving force behind the need to improve performance and reduce the cost of IC packaging. The semiconductor industry has employed several strategies to meet the rapidly growing demands for improved IC packaging. One approach has been to provide an IC package in a die up configuration, such as overmolded plastic pad array carriers (OMPAC). OMPACs have been used for decades to provide a low cost solution for IC packages that require high interconnect density. However, on-chip wireless communication elements often cannot be implemented in OMPACs.

In recent years, another approach has included the use of a die down IC package configuration that includes an antenna attached to the top surface of a substrate. This die down IC package configuration, however has higher design cost and added complexity. Additionally, OMPACs and other device packages suffer from poor thermal dissipation and poor electromagnetic radiation protection. Performance can be compromised because ideal design requirements for wireless communication elements and IC dies are often at odds.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 illustrates a cross-sectional view of a conventional plastic ball grid array (PBGA).

FIG. 2 illustrates a cross-sectional view of a conventional flip-chip package.

FIGS. 8a-8e collectively illustrate different interposers, according to embodiments of the present invention.

Figure 9A:
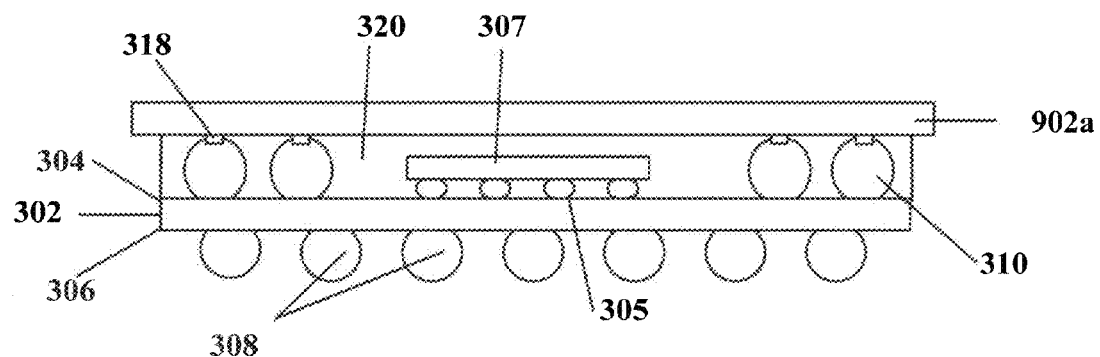

FIG. 9a illustrates a cross-sectional view of an interposer package structure, according to embodiments of the present invention.

Figure 9B:
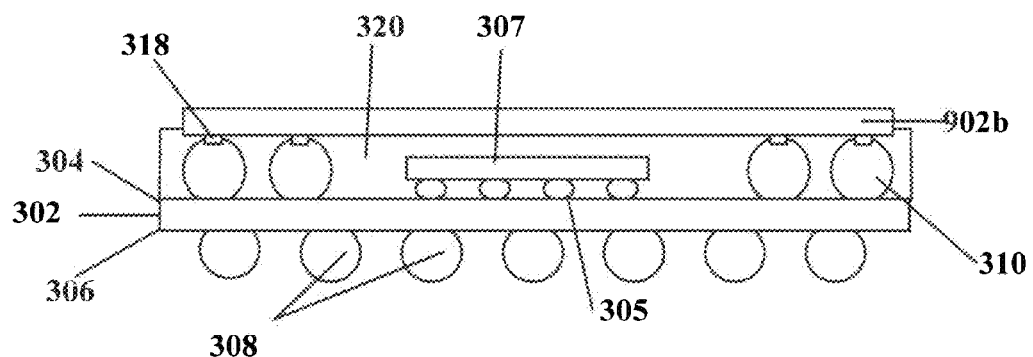

FIG. 9b illustrates a cross-sectional view of an interposer package structure, according to embodiments of the present invention.

Figure 9C:
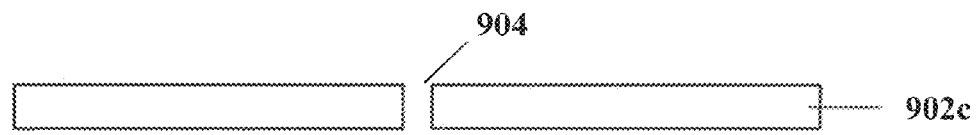

FIG. 9c illustrates a cross-sectional view of an interposer, according to embodiments of the present invention.

Figure 9D:
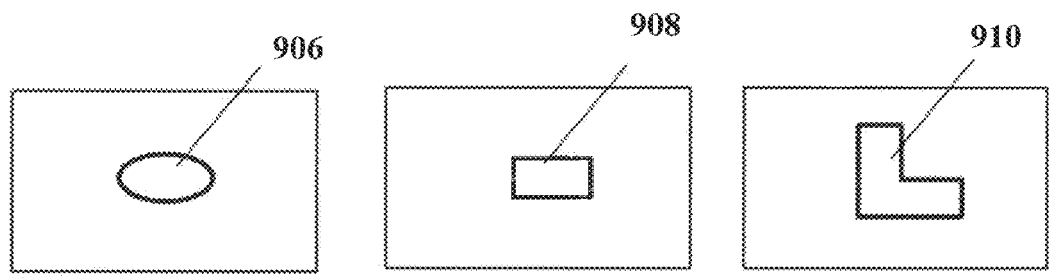

FIG. 9d illustrates various views of an interposer package structure, according to embodiments of the present invention.

Figure 10:
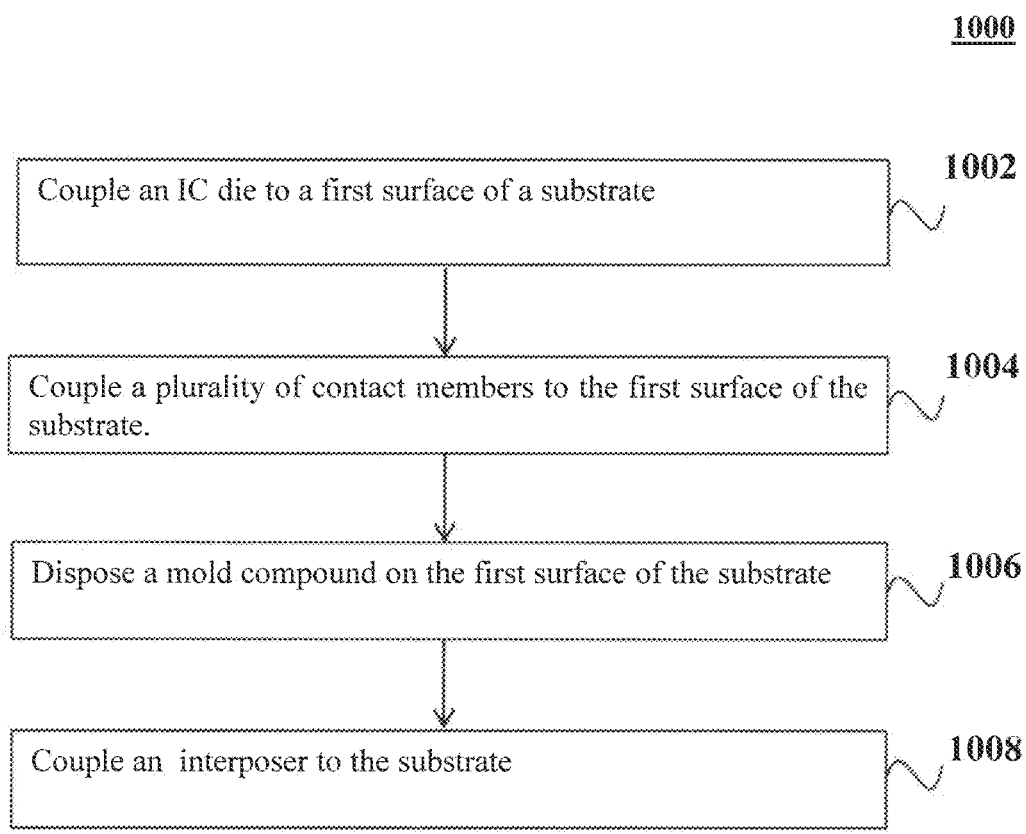

FIG. 10 illustrates a flowchart providing example steps for assembling an IC device, according to embodiments of the present invention.

The present invention will be described with reference to the accompanying drawings. The drawing in which an element first appears is typically indicated by the leftmost digit (s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

Reference in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 1 shows a cross-sectional view of a conventional integrated circuit (IC) plastic ball gate array (PBGA) package 100. IC package 100 includes a substrate 102, solder balls 104, an IC die 106, an epoxy 108, wirebond interconnects 110, and a mold compound 112. IC die 106 is attached to substrate 102 through epoxy 108. Substrate 102 can be made of Bismaleimide Triazine (BT) resin or FR4 materials. In another embodiment, IC die 106 is also electrically coupled to substrate 102 through wirebond interconnects 110. Mold compound 112 is disposed over substrate 102 and encases IC die 106. Mold compound 112 can be any of a number of compounds known to those skilled in the art, such as a plastic or an epoxy.

IC package 100 can suffer from a number of drawbacks. For example, IC package 100 may have no room for on-package wireless elements, such as antennas, baluns, or inductors. Consequently, the cost of a system having IC package 100 is increased and its performance is diminished because additional wireless elements may have to be implemented off-package.

Moreover, IC package 100 can have poor thermal performance. For example, substrate 102 and the plastic mold compound 112 have low thermal conductivity values (e.g., approximately 0.19-0.3 W/m° C. for BT or FR4 type substrates). Since IC die 106 is encased by materials with poor heat conduction properties, the heat produced by IC die 106 is trapped within IC package 100. Furthermore, substrate 102 and plastic mold compound 112 can be transparent to electromagnetic radiation. Thus, electromagnetic radiation generated by IC die 106 will escape from IC package 100 causing interference with other electronic components. IC die 106 is also unprotected from electromagnetic radiation emitted from other components.

FIG. 2 shows a cross-sectional view of a conventional IC package 200. IC package 200 includes a substrate 202, solder balls 204, an IC die 206, and an antenna 208. IC die 206 can be mounted to substrate 202 in a flip chip configuration. Substrate 202 has a first surface 201 and a second surface 203. IC die 206 is attached to first surface 201 of substrate 202. IC die 206 is electrically coupled to substrate 202 by solder bumps 210. In the embodiment shown in FIG. 2, antenna 208 is an antenna array. Antenna 208 is located on the second surface 203 of substrate 202. IC package 200 can be implemented in an IC die down configuration. IC die down configurations can be used to avoid interference from active elements or high speed traces on the same surface. The die down restriction allows an antenna to be placed on the top surface of the substrate.

IC package 200 also suffers from a number of drawbacks. For example, the line/spacing requirement for flip chip die are usually stricter than for the antenna, dielectric material requirements between the flip chip die and the antenna are different, and higher manufacturing cost because substrate must meet requirements for both the flip chip die and the antenna. For example, routing on a substrate for a flip chip die is dense and requires trace and line spacing to be fine to accommodate high density routing or high density interconnects. Antenna 208 is also located on substrate 202, and does not require the strict fine trace and line spacing. Conversely, antenna 208 may perform better with relatively larger traces. Thus, IC die 206 and antenna 228 can impose competing demands on substrate 202.

Moreover, IC die 200 and antenna 208 can impose competing demands on the thickness of substrate 202. In some embodiments, a substrate suitable for antenna 208 often is two to three times thicker than what is required of IC die 206. Often antenna 208 can require extra layers of dielectric material be added to substrate 202. These extra dielectric layers often serve no other purpose, but can increase the cost of substrate 202 and lead to signal degradation.

Figure 3A:
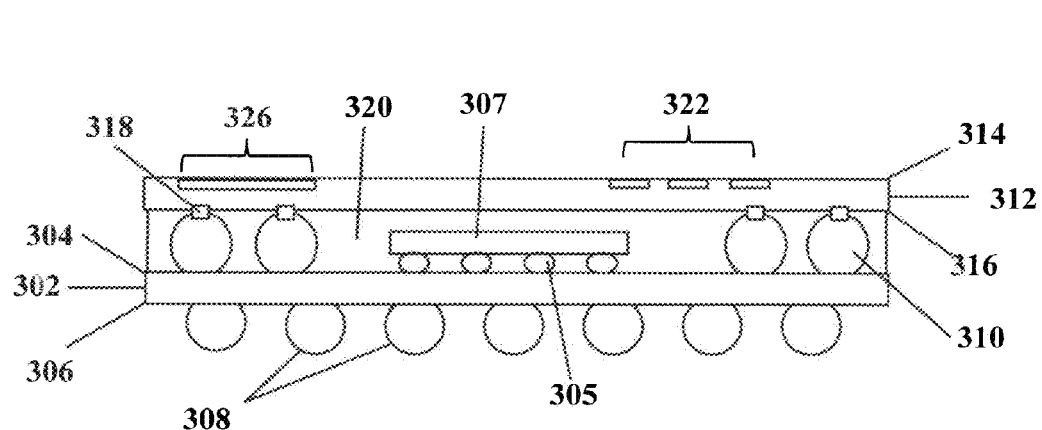
FIGS. 3a-3e illustrate cross-sectional views of an interposer package structure for wireless communication, according to embodiments of the present invention.
Figure 3B:
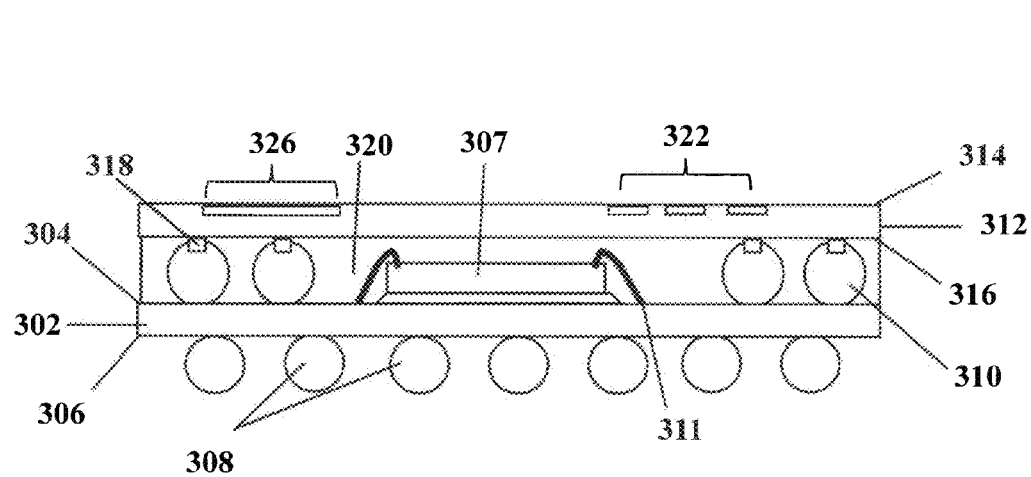

FIGS. 3a-3b show diagrams of IC devices 300 and 350, respectively, according to embodiments of present invention. IC device 300 includes a bottom package having a substrate 302, an IC die 307, solder balls 308, solder bumps 305, contact members 310, and a mold compound 320. IC device 300 also includes a top package having an interposer 312, contact elements 318, and an antenna 322. IC device 350 is substantially similar to IC device 300 except that IC device 350 includes wire bonds 311 that electrically couples IC die 307 to substrate 302, instead of solder bumps 305.

Substrate 302 has a first surface 304 and a second surface 306. Substrate 302 can be either stiff or flexible and can be made of one or more conductive layers. The conductive layers can be made from a metal, or combinations of metals, e.g., the metals can be selected from a group including aluminum, copper, and gold. Trace elements or routing patterns can be formed in the conductive layers. The conductive layers can be bonded with a dielectric material. The dielectric layers can be made from various substances, such as polyimide tape. Solder balls 308 are coupled to the bottom surface 306 of substrate 302. Solder balls 308 can be configured to couple the substrate 302 to a printed circuit broad (PCB) (not shown). Alternatively, other coupling elements can be used to couple substrate 302 to a PCB, such as pins or posts.

IC die 307 can be a flip chip IC die that is physically and electrically coupled to substrate 302 through solder bumps 305, as shown in FIG. 3a. Alternatively, as shown in FIG. 3b, IC die 307 can also be physically coupled to substrate 302 using epoxy or any suitable adhesive and electrically coupled to substrate 302 by wire bonds 311. IC die 307 can be various types of IC die, such as a memory or an application-specific integrated circuit (ASIC). Conductive members 310 are located around IC die 307. Conductive members 310 are coupled to first surface 304 of substrate 302. Conductive members 310 can be solder balls or other suitable conductive elements. Contact members 310 and IC die 307 are encapsulated by mold compound 320. Mold compound 320 can be made of plastic or any other suitable molding material. Mold compound 320 can protect IC die 307 and contact members 310 from the surrounding environment. Contact members 310 can be substantially flush with the top surface of the mold compound 320. The top surfaces of contact members 310 are exposed to facilitate electrical interconnection with interposer 312.

Interposer 312 has a first surface 316 and a second surface 314. Interposer 312 can be either stiff or flexible substrate and can include one or more conductive layers. Interposer 312 can be used to facilitate wireless communication between the IC die and another device. For example, the other devices can include a cellular phone, a personal computer, a cellular tower, a device package, or a NFC scanning device. Contact elements 318 are coupled to the first surface of interposer 316. Contact elements 318 can be contact posts made of copper. Alternatively, contact elements 31 can be made of aluminum, gold, or any other suitable conductive material known to those skilled in the art. Contact elements 318 of interposer 312 are coupled to the respective ones of contact members 310. The electrical interconnection of interposer 312 contact elements 318 and contact members 310 electrically couples the top package to bottom package. This interconnection allows high speed signaling between the bottom package and the top package.

A wireless communication element 322 is located on the second surface 314 of interposer 312, wireless communication element 322 can be a beam-forming antenna array. Beam-forming antenna array amplifies and steers a signal into a given direction to reduce interference and improve communication performance. FIGS. 3a-3b show interposers, having beam-forming antenna arrays as their wireless communication element. In one example, wireless communication element 322 can located on a middle conductive layers within interposer 312. Alternatively, the wireless communication element 322 can be located on the first surface 316 of interposer 312. In both examples, the wireless communicate element can be used to radiate signals.

Figure 3C:
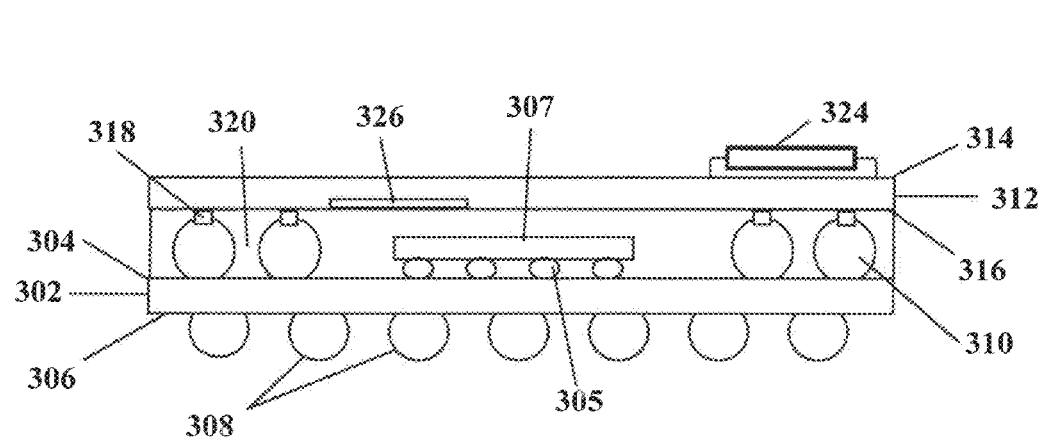

FIG. 3c shows a diagram of an IC device 360, according to an embodiment of the present invention. IC device 360 is similar to IC device 300, shown in FIG. 3a, except that interposer 312 includes a wireless communication element 326 on the first surface 316 of interposer 312. Interposer 312 also includes a capacitor 324 coupled to the second surface 314.

Other suitable passive devices can also be coupled the second surface 314 of the interposer 312, such as inductors or resistors.

Figure 3D:
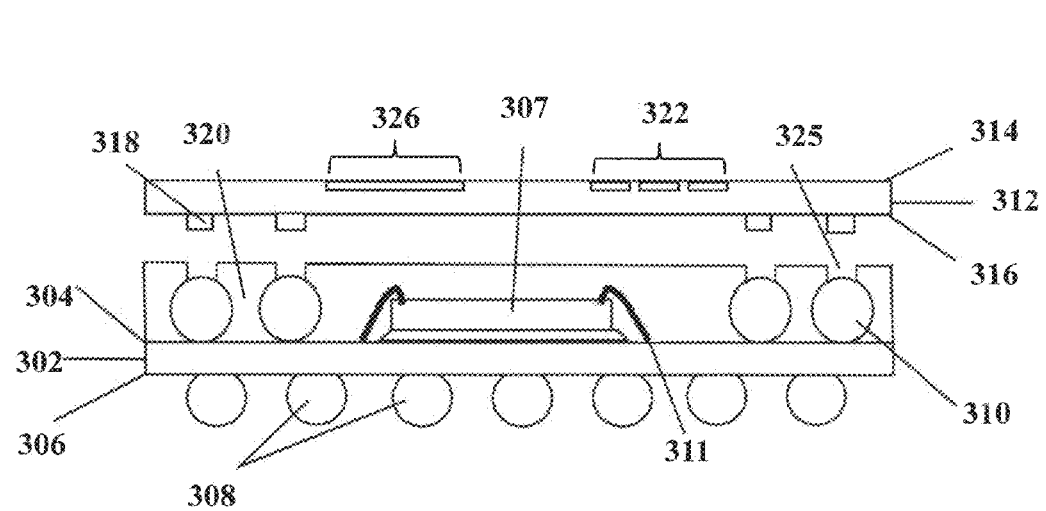

FIG. 3d shows a diagram of an IC device 370, according to an embodiment of the present invention. IC device 370 is similar to IC device 350, shown in FIG. 3b, except that the plurality of contact members 310 can be completely encased by mold compound 320. The mold compound 320 has recessed openings 32.5 above each contact member 310. Recessed openings 325 allow for electrical interconnection between contact elements 318 and contact members 310.

Figure 3E:
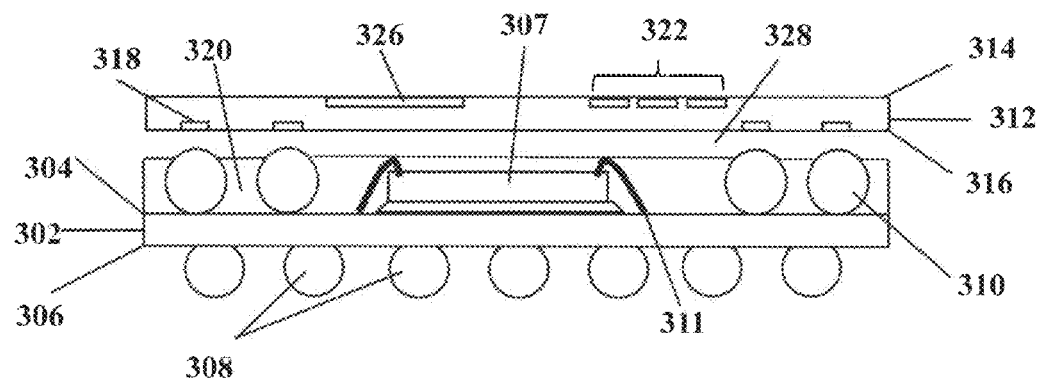

FIG. 3e shows a diagram of an IC device 380, according to an embodiment of the present invention. IC device 380 is similar to IC device 350, shown in FIG. 3b, except that portions of the plurality of contact members 310 are left exposed by mold compound 320. For example, mold compound 320 can be disposed on first surface 304 of the substrate 302 such that contact members 310 are partially exposed. Each contact element 318 is respectively interconnected to one of the plurality of contact members 310. In the embodiment of FIG. 3e, contact elements 318 are conductive pads. The partially exposed of contact members 310 create a gap between mold compound 320 and interposer 312.

Figure 4A:
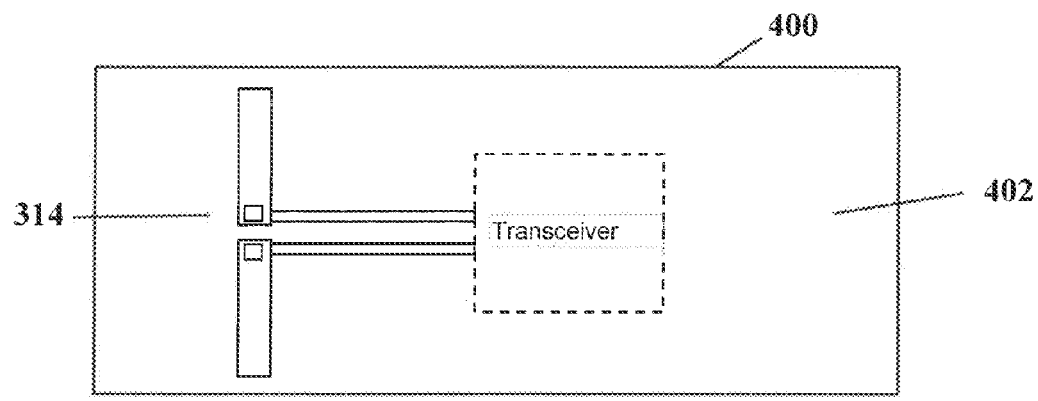
FIGS. 4a-4c illustrate top views of an interposer package structure configured for wireless communication, according to embodiments of the present invention.
Figure 4B:
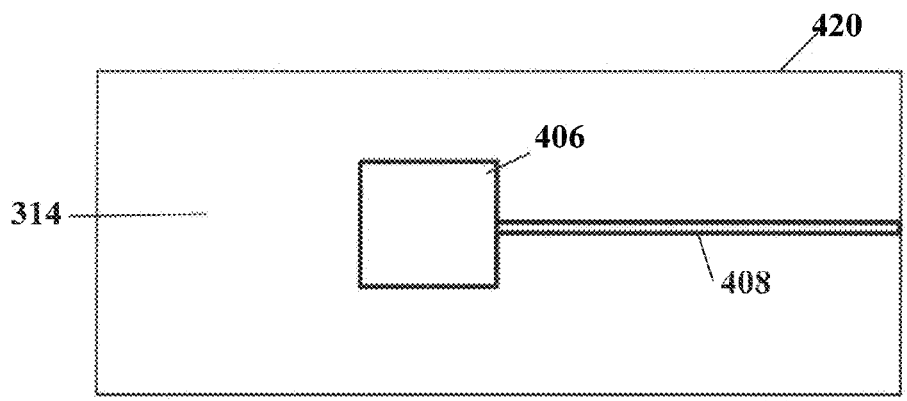
Figure 4C:
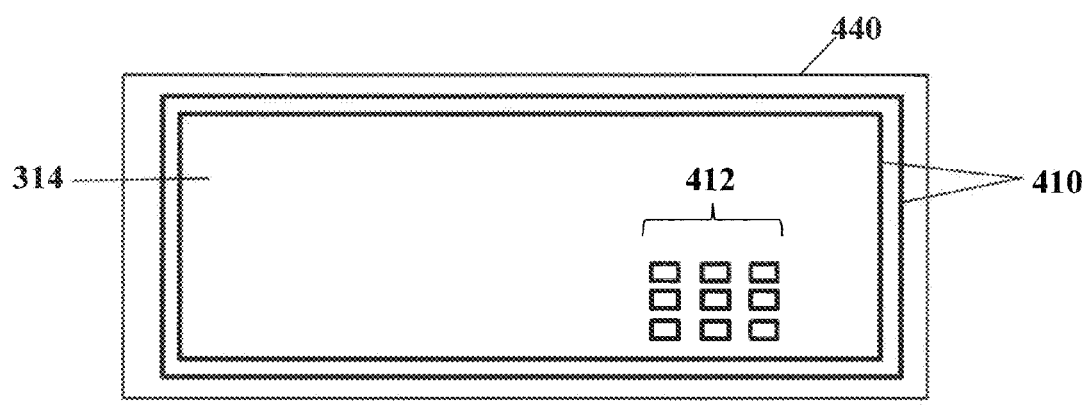

FIGS. 4a, 4b, and 4c show top view diagrams of interposer 312 having wireless communication elements 400, 420, and 440, respectively, according to embodiments of present invention.

Wireless element 400 includes a dipole antenna that can be located on the second surface 314 of interposer 312. Dipole antenna 400 includes traces 402 that are position in opposing directions from one another. Traces 402 can be connected to a transceiver 404. As shown in FIG. 4b, wireless communication element 420 is a micro strip antenna. Micro strip antenna 420 can be located on the second surface 314 of the interposer 312. Micro strip antenna 420 includes a conductive patch 406 that is connected to a transmission line 408. As shown in FIG. 4c, wireless element 440 can include an inductor 410 and a beam-forming antenna array 412 that is located on second surface 314 of the interposer 312. Inductor 410 can be implemented as loops of one or more conductive traces that can be formed around the periphery of the second surface of interposer 314. The conductive trace can be made of copper, copper alloy, or aluminum.

Inductor 410 can be useful in many wireless communication and IC packaging applications. In one example, inductor 410 is useful in near field communication (NFC) systems. NFC is a set of short-range wireless technologies that usually requires a distance of less than or equal to 4 centimeters. NFC systems operate at 13.56 MHZ and at rates ranging from approximately 100 Kbit/s to 850 Kbit/s. NCF systems include a NFC IC device and a NFC reader. Often, NFC systems must be implemented off-package because conventional IC packaging does not have the capacity to accommodate an inductor that is large enough to provide the required inductance for the NFC IC device to be read by the NFC readers. An advantage of the configuration shown in FIG. 4c is that IC device 300 is large enough to accommodate an inductor that generates the appropriate amount of inductance needed for the NFC IC device to be read by the NFC reader.

Another advantage of IC device 300 is the ability to harvest power. Inductor 410 can act like a standard wireless transceiver antenna and a battery for IC device 307. In one example, inductor 410 can use NFC technologies. For example, an IC device, such as a proximity card, can use inductor 410 to harvest the current that is generated from the antenna 412. When the proximity card is read through a magnetic field reader, an inductor converts the energy from the magnetic field reader into current. The current can then be fed back into the proximity card and used to power IC die 307. Thus, IC die 307 can function without needing a power source, such as a battery. Capacitors can be used to store harvested energies. Those skilled in the art will appreciate that there are other applications of NFC technology being used in wireless communication device and this is an example, and not a limitation.

In one example, a first wireless communication element 322 and a second wireless communication element 326 can be coupled to the second surface of interposer 314, as shown in FIG. 3a. The first wireless communication element and the second communication element can be antennas. The first wireless communication element 322 can be configured for cellular applications and the second wireless communication element 326 can be configured for non-cellular applications. In one example, the non-cellular applications can include one or more Bluetooth, NFC, broadcast mobile TV (mobile TV), global positioning system (UPS), frequency modulation (FM) radio, or Wi-Fi. In another example, second wireless communication element 326 can also be configured for or multi-band applications. Multi-band applications can include the capability to switch frequencies. For example, a dual-band GSM phone could use GSM services in either a 900-MHz or an 1800-MHz system.

Figure 5:
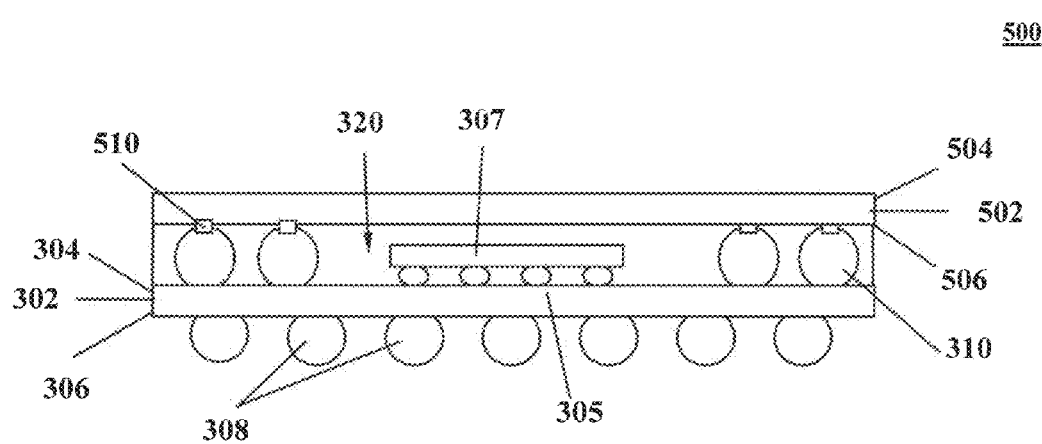
FIG. 5 illustrates a cross-sectional view of an interposer package structure configured for wireless communication, according to embodiments of the present invention.

FIG. 5 shows a diagram of an IC device 500, according to an embodiment of the present invention. IC device 500 is similar to IC device 300, shown in FIGS. 3a and 3b, except that interposer 502 includes a wireless communication element. Interposer 502 can be a substrate having a first surface 506 and a second surface 504, as described above. First surface 506 includes contact elements 510. Interposer 502 can include one or more conductive layers. For example, the conductive layers can be made of copper, copper alloy, and gold. The conductive layers can be bonded with a dielectric layer. The dielectric layer can be made from various substances, such as Upilex-S polyimide tape or FR4.

Figure 6A:
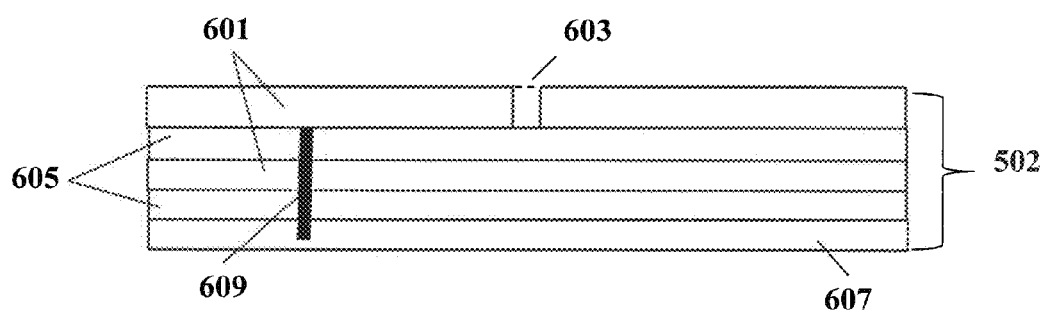
FIG. 6a illustrates a cross-sectional view of an interposer, according to an embodiment of the present invention.

FIG. 6a shows one example of a cross-section diagram of interposer 502, according to an embodiment of the present invention. Interposer 502 can include at least one conductive layer 601, at least one dielectric layer 605 and a ground plane 607. Conductive layers 601 can be copper or aluminum. Copper layers 601 can be coupled to dielectric layers 605. It one embodiment, interposer 502 can be a slot antenna. For example, interposer 502 can have a slot 603. Slot 603 can be formed using manufacturing processes known to those skilled in the relevant arts, such as stamping machining, casting, or chemical etching.

Figure 6B:
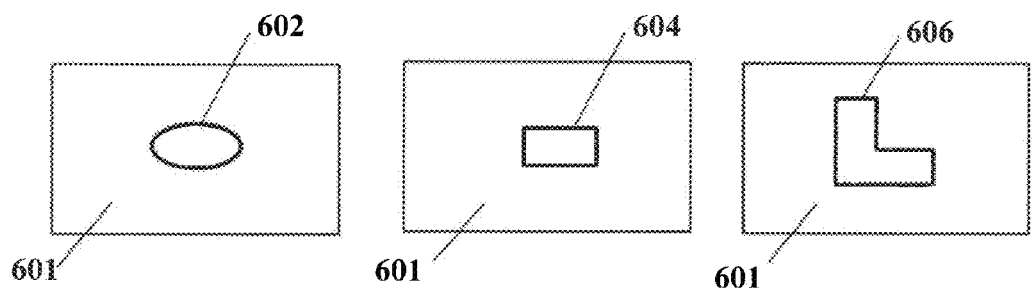
FIG. 6b illustrates various configurations of an interposer, according to embodiments of the present invention.

FIG. 6b shows various configurations of slot 603 on interposer 502, according to an embodiment of the present invention. For example, slot 603 can be a hole 602, a rectangle 604, or an L-shape 606, as shown in FIG. 6b. When a driving frequency is applied across conductive layer 601, slot 603 radiates electromagnetic waves that are linearly polarized. A wide variety of radiation distribution patterns can be produce by varying the shape and size of the slot, in conjunction with varying the driving frequency. The ability to produce a variety of radiation distribution patterns allow slot antennas to be used in numerous wireless communication applications.

Referring back to FIG. 6a, a conductive via 609 can be used to couple copper layers 601 to ground plane 607. The ground plane 607 can be coupled to a transmission feed (not shown). For example, ground plane 607 can be a layer of copper that appears to most signals as an infinite ground potential. This helps reduce noise and helps ensure that all IC components within an IC package compare different signals to the same reference potential.

Figure 6C:
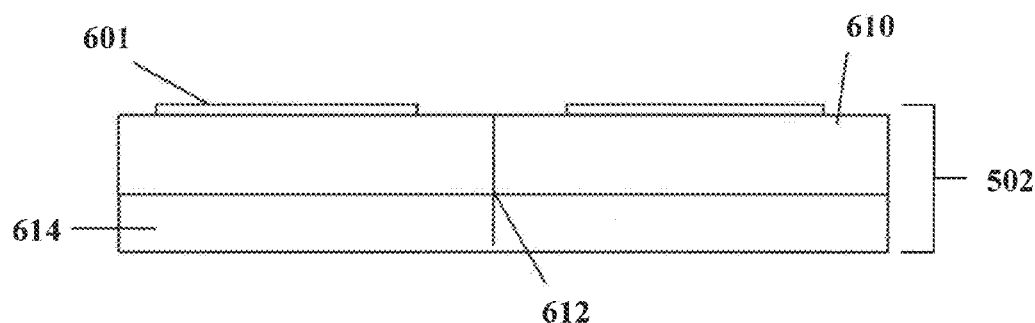
FIG. 6c illustrates a cross-sectional view of an interposer, according to embodiments of the present invention.

FIG. 6c shows a cross sectional diagram of an interposer 650, according to an embodiment of the present invention. Interposer 650 includes a dipole antenna 608. As shown in FIG. 6c, interposer 650 includes a conductive layer 601, a dielectric layer 610, conductive via 612 and a ground plane 614. Conductive layer 601 can be a layer of copper, copper alloy, or other suitable conductive materials. An etching process can be applied to the copper layer 601 to form a dipole antenna 608. For example, the etching process can be dry etching, plasma etching, wet etching, or mechanical etching. Alternatively, a lithographic process also can be used to form the pattern of the dipole antenna. Dielectric layer 610 is coupled to copper layer 601.

Figure 6D:
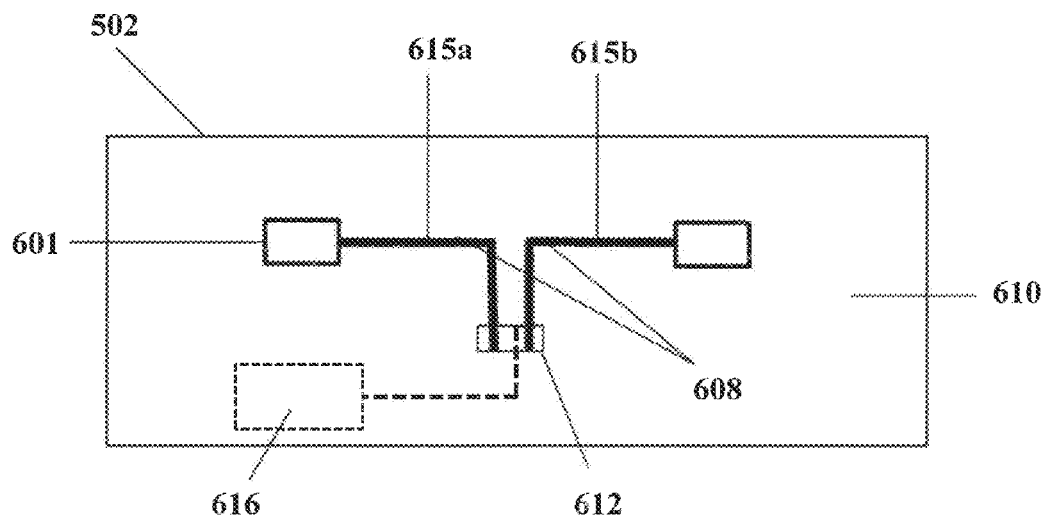
FIG. 6d illustrates a top view of an interposer, according to embodiments of the present invention.

FIG. 6d shows a top view of copper layer 601 after an etching process has been applied, according to an embodiment of the present invention. Copper layer 601 can be patterned into a first trace 615a and a second trace 615b, which are oriented parallel and opposite from one another. For example, as shown in FIG. 6d, one end of first trace 615a and one end of second trace 615b are pointed in opposite directions. The other end of first trace 615a and second trace 615b can be connected to a signal source, such as a radio transceiver or any other communication device. The orientation of first trace 615a and second trace 615b can be either horizontal or vertical. First trace 615a and second trace 615b are separated by a small space. A conductive via 612 can be used to couple copper layer 601 to ground plane 614. The ground plane 614 can be couple to a transmission fed (not shown).

Copper layer 601 of interposer 650 can also be patterned as a whip antenna, a micro-strip antenna, a quarter wavelength monopole antenna or a beam-forming antenna array using similar processes as described above.

Optionally, as shown in FIG. 6d, one of the conductive layers 601 of interposer 650 can include an integrated micro electromechanical system (MEMS) turning circuit or an integrated frequency turning circuit. MEMS is the technology of very small mechanical devices operated by electricity. Developments have been made using MEMS based electrostatically tunable circuits to overcome bandwidth limitations. For example, dipole antenna 608 can be coupled to a MEMS device 616. MEMS device 616 can be a reactive tuning component that increases the bandwidth of dipole antenna 608 by loading reactance to interposer 650. The reactive tuning device 616 can either be an electrically controlled reactance or a passive switching device. In this configuration the bandwidth limit of interposer 650 can be increased by tuning its resonant frequency.

In another embodiment, dipole antenna 608 can be coupled to a frequency turning circuit integrated into interposer 650 to overcome bandwidth limitations.

In another embodiment, interposer 650 can also include a capacitor. For example, interposer 650 can include a parallel plate capacitor including a dielectric layer 605 disposed between two conductive layers copper layers 601. The dielectric layer 605 can be a thin film dielectric made of a high K material or any other suitable dielectric material. The conductive layers 601 can be made of copper or aluminum. The parallel plate capacitor can be coupled to ground plane 607 using conductive via 609. Similarly, interposer 650 can include a touch sensor by using conductive layers 601.

Thermally Conductive and EMI Shielding Interposer

One conventional heat spreader includes a conductive layer of metal that is glued on top of an IC package. However, a drawback to this configuration is that warping can be caused by improper application at the time of assembly or by excessive heat. Another drawback is that an adhesive layer has to be applied between the heat spreader and the mold compound, increasing thermal resistance between the die and the heat spreader. Another conventional heat spreader is an "integrated" heat spreader that includes a cavity that accommodates the IC die. This integrated heat spreader is attached to BGA package substrate before the molding process for die encapsulation. However, a drawback to this configuration is the size of the heat spreader must be smaller than the size of mold. Additionally, the wire bonds must be kept within the cavity of the integrated heat spreader.

Figure 7:
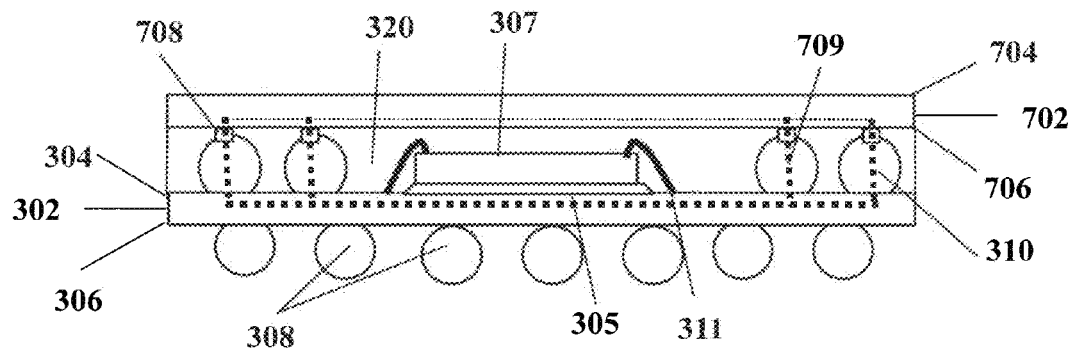
FIG. 7 illustrates a further cross-sectional view of an interposer package structure for thermal enhancement and EMI shielding, according to embodiments of the present invention.

FIG. 7 shows a diagram of an IC device 700, according to an embodiment of the present invention. IC device 700 is similar to IC devices 300 and 350, shown in FIGS. 3a and 3b, respectively, except that interposer 702 is a thermally conductive heat spreader. Interposer 702 has a first surface 706 and a second surface 704. Interposer 702 can be made of thermally conductive materials, such as metals, metal alloys, graphite, or ceramics. For example, interposer 702 can be a metallic interposer made of single conductive layer of copper, aluminum, copper alloys or other suitable thermally conductive materials. The first surface 706 of interposer 702 has a plurality of contact elements 708.

Figure 8A:
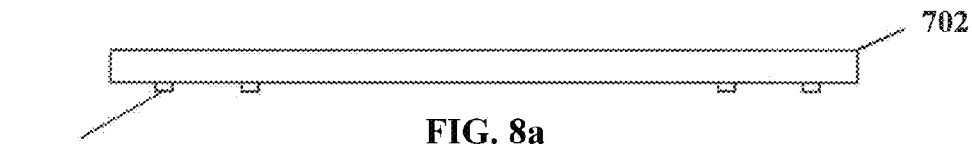
Figure 8B:
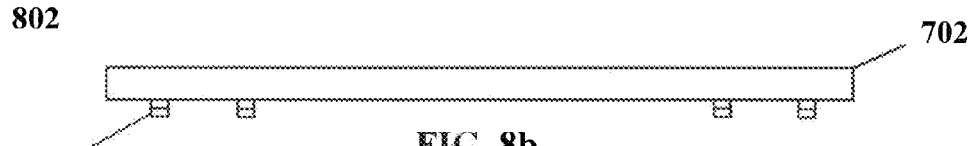
Figure 8C:
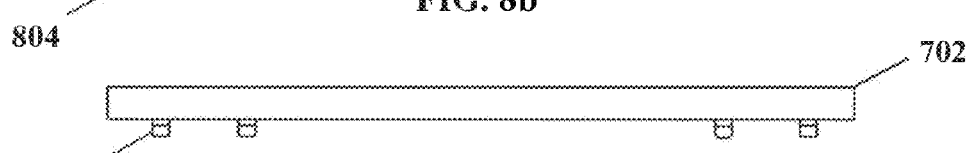
Figure 8D:
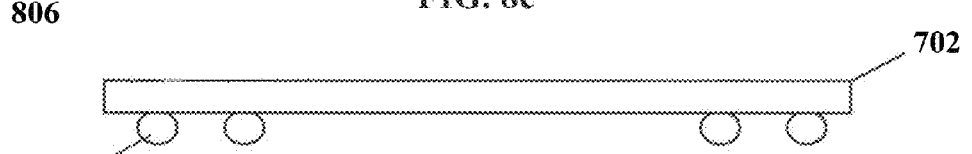
Figure 8E:
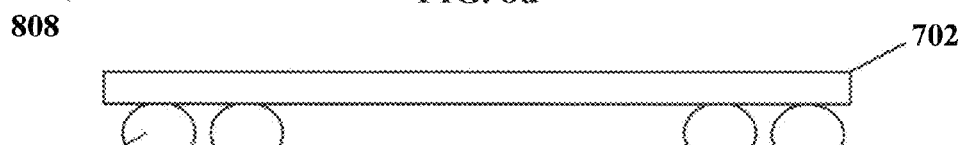

FIGS. 8a-8d show various embodiment of contact elements used to couple interposer 702 to contact members 310. Contact elements 708 can be conductor posts 802, as shown in FIG. 8a. The tips of conductor posts 802 can be plated solder posts 804, as shown in FIG. 8b. Plated solder posts 804 can be plated with tin, tin and silver alloy, or other metal of nonmetal materials. Solder caps 806 can be placed on the tips of the contact posts 708, as shown in FIG. 8c. Alternatively, small solder bumps 808 or solder balls 810 can be attached directly on the first surface 706 of interposer 702 to replace contact elements 708, as shown in FIG. 8d. In still another embodiment, solder balls 810 can be used as contact elements, as shown in FIG. 8e. Although described with respect to the embodiment in which an interposer is a heat spreader, the different types of conductive elements are equally as applicable to the embodiment in which the interposer facilitates wireless communication between the IC die and another device as shown in FIGS. 3a and 3b.

Contact elements 708 on first surface 706 of interposer 702 are coupled to respective ones of contact members 310. All components on the bottom package are locked into place by the molding process. For example, contact elements 708 can be coupled to respective ones of contact members 310 after molding process. An advantage of coupling after the molding process is that air gaps are prevented from forming between interposer 702 and the bottom package. For example, heat that radiates through substrate 302 and from IC die 307 can be released through mold compound 320 and contact members 310 that are interconnected to heat spreader 702. Interposer 702 can then dissipate heat into the surrounding environment.

In another embodiment of the present invention interposer 702 can be configured to provide shielding of electromagnetic interference. Interposer 702 can be made of an electrical conductor, such as copper, copper alloy or aluminum. The first surface 706 of interposer 702 has a plurality of contact elements 708 that are respectively coupled to contact members 310. Contact members 310 can have embedded conductive mold vias 709. Conductive mold vias 709 can be used to couple interposer 702 to a ground plane (not shown). Alternatively, contact members 310 can be conductive vias. Contact members 310 and interposer 702 can be used in conjunction to form a Faraday Cage. The Faraday Cage is coupled to a ground potential.

A Faraday cage is a conductive enclosure used to block interferences caused by electromagnetic radiation. Electromagnetic interference (EMI) can be shielded by blocking the electromagnetic radiation with barriers made of conductive materials. Advantageously, interposer 702 provides on-package EMI shielding for IC die 307. EMI shielding protects IC die 307 from electromagnetic radiation within and outside IC device 700.

FIGS. 9a and 9b show cross sectional diagrams of IC devices 900 and 920. IC device 900 is similar to IC devices 300, as shown in FIG. 3a, except that IC device 900 includes interposer 902a that is larger than substrate 302 in at least one dimension, as shown in FIG. 9a, IC device 920 is substantially similar to IC device 350, shown in FIG. 3b, except that IC device 920 includes interposer 902b that is smaller than substrate 302 in at least one dimension, as shown in FIG. 9b, Interposer 900 and 920 can be ones that facilitate wireless communication, like described above, or ones that function as heat spreaders and EMI shields like described above.

FIGS. 9c and 9d shows a cross sectional diagram of interposer 902 and various top view configurations of interposer 902. In one example, interposers 902a and 902b can have a slot 904, as shown in FIG. 9c. Slot 904 can be located in the center of interposer 902. The shape of slot 904 can be a hole 906, a rectangle 908 or an L-shape 910, as shown in FIG. 9d.

FIG. 10 is a flowchart of an exemplary process 1000 of assembly of an IC device. Other structural embodiments will be apparent to persons skilled in the relevant art(s) based on the following discussion. The steps shown in FIG. 10 do not have to occur in the order shown. Nor does method 1000 require all of the steps shown in FIG. 10 be performed. The steps of FIG. 10 are described in detail below.

In step 1002, an IC die is coupled to a first surface of a substrate. For example, in FIG. 3a IC die 307 can be coupled to first surface 304 of substrate 302 using solder bumps 305. Alternatively, IC die 307 can be coupled physically to the first surface of substrate 304 with epoxy or other suitable adhesive, as shown in FIG. 3h. In such an embodiment, IC die 307 can also be electrically coupled to the first surface 304 of the substrate 302 using bond wire 311, as shown in FIG. 3b.

In step 1004, a plurality of contact members are coupled to the first surface of the substrate. For example, in FIG. 3a, contact members 310 can be coupled to the first surface 304 of substrate 302. The plurality of contact members 310 are solder balls. Alternatively, contact members 310 can be pins or other suitable conductive elements known to those skilled in the art.

In step 1006, a mold compound is disposed on the first surface of the substrate. For example, the mold compound 320 can be disposed on the first surface 304 of the substrate 302 such that the plurality of contact members 310 are substantially flush with the surface of the mold compound 320, as shown in FIG. 3a.

In another example, the plurality of contact members 310 can be completely encased by mold compound 320. The mold compound 320 can have recessed openings 325 formed (e.g. drilled) above each contact member 310. Recessed openings 325 allow for electrical interconnection of contact elements 318 that are coupled to first surface 316 of interposer 312, as shown in FIG. 3d. The mold compound can also encase the IC die. For example, in FIG. 3d mold compound 320 is disposed on the first surface 304 of substrate 302. Mold compound 320 encases IC die 307 and bond wires 311.

In another example, portions of the plurality of contact members are left exposed by the mold compound. For example, mold compound 320 can be disposed on the first surface 304 of the substrate 302 such that contact members 310 are partially exposed. Each contact member 310 is respectively interconnected to one of a plurality of contact elements 318. In a further embodiment the plurality of contact elements 318 can be conductive pads. Partial encasing of contact members 310 creates a gap between mold compound 320 and interposer 312, as shown in FIG. 3e. Methods for disposing mold compounds and exposing contact members are described in greater detail in U.S. patent application Ser. No. 13/174,066, "Package 3D Interconnection and Method of Same," filed Jun. 30, 2011, by Khan et al., is incorporated herein by reference in its entirety, as though set forth in full below.

In step 1008, an interposer is coupled to a substrate through a plurality of contact elements located on a second surface of the interposer. In one example, interposer 312 can be formed of either stiff or flexible substrate that includes one or more conductive layers. The conductive layer can be copper, aluminum or any other suitable conductive elements. Contact elements 318 are then coupled to the first surface 316 of interposer 312. For example, contact elements 318 can be contact posts, plated solder posts, solder caps, small solder bumps or solder balls. Alternatively, the first surface 316 of interposer 312 can have contact elements formed by using manufacturing processes known to those skilled in the relevant arts, such as stamping machining, casting, or chemical etching. Contact elements 318 can be coupled to respective contact members 310 that are attached to substrate 302. The coupling of contact elements 318 of interposer 312 with respective ones of plurality of contact members 310 interconnects substrate 302 to interposer 312.

The interposer can be one that facilitates wireless communication one that provides heat spreading and EMI shielding between the IC die and another device. In one example, interposer 312 can have a first wireless element 322, such as a first antenna coupled to a second surface 314 of interposer 312. For example, the first antenna 322 can be configured to communicate with IC die 307, as shown in FIG. 3a. In another example, interposer 702 can be a solid conductive layer configured to spread heat and to provide EMI shielding as shown in FIG. 7.

Alternatively, interposer can be configured to facilitate wireless communication. For example, interposer 502 can include a dipole antenna, a whip antenna, a micro-strip antenna, or a quarter wavelength monopole antenna. In addition to a wireless element as described above, interposer 502 can include a frequency turning circuit or a micro electromechanical system (MEMS) turning element integrated within. The frequency turning element and MEMS can be used in conjunction with a ground plane that allows for timing of interposer 502.

CONCLUSION

It is to be appreciated that the Detailed Description section, and not the Abstract section, is intended to be used to interpret the claims. The Abstract section is intended to be used to interpret the claims. The Abstract section may set forth one or more but not all exemplary embodiment of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and for adapt for various applications such specific embodiments, without undue experimentation, without departing form the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed:

1. An integrated circuit (IC) device, comprising:
    a substrate having first and second opposing surfaces;
    an IC die electrically coupled to the first surface of the substrate;
    a plurality of contact members coupled to the first surface of the substrate; and
    an interposer, comprising:
        a plurality of contact elements located on a first surface thereof, each contact element being coupled to a respective one of the plurality of contact members;
        first and second conductive layers separated by a dielectric layer; and
        an antenna formed using at least one of the first and second conductive layers, the antenna being electrically coupled to the IC die through at least one of the plurality of contact elements and at least one of the plurality of contact members.

2. The IC device of claim 1, wherein the antenna is configured to facilitate wireless communication between the IQ die and another device and wherein the other device comprises at least one of a cellular phone, a personal computer, a cellular tower, or a near field communication NFC scanning device.

3. The IC device of claim 1, further comprising:
    a mold compound disposed between the first surface of the substrate and the first surface of the interposer such that a surface of each of the plurality of contact members is substantially flush with a surface of the mold compound, wherein the mold compound encases the IC die.

4. The IC device of claim 1, wherein the antenna is formed on a second surface of the interposer, wherein the second surface of the interposer opposes the first surface of the interposer.

5. The IC device of claim 1, further comprising:
    an inductor attached to a second surface of the interposer, wherein the second surface of the interposer opposes the first surface of the interposer.

6. The IC device of claim 5, wherein the antenna and the inductor are configured to wirelessly harvest power.

7. The IC device of claim 1, wherein the first and second conductive layers together form the antenna.

8. The IC device of claim 7, wherein the antenna comprises at least one of a dipole antenna, a slot antenna, an antenna of an antenna array, or a microstrip antenna.

9. The IC device of claim 7, wherein the interposer further comprises:
    a micro electromechanical system (MEMS) turning element, the MEMS turning element being configured to tune the wireless communication element.

10. The IC device of claim 1, wherein the interposer includes a frequency turning circuit, the frequency turning circuit being configured to tune the antenna.

11. The IC device of claim 1, wherein the interposer comprises a capacitor, the capacitor comprising at least a portion of at least one of the first or second conductive layers.

12. The IC device of claim 1, further comprising:
    a capacitor coupled to a second surface of the interposer, the second surface of the interposer opposing the first surface of the interposer.

13. An integrated circuit (IC) device, comprising:
    a substrate having first and second opposing surfaces;
    an IC die electrically coupled to the first surface of the substrate;
    a plurality of contact members coupled to the first surface of the substrate;
    an interposer having a plurality of contact elements located on a first surface thereof, each contact element coupled to a respective one of the plurality of contact members, wherein the interposer is configured to facilitate wireless communication between the IC die and another device;
    a first antenna located on a second surface of the interposer, wherein the second surface of the interposer opposes the first surface of the interposer; and
    a second antenna located on the second surface of the interposer,
    wherein the first antenna is configured for cellular applications and the second antenna is configured for non-cellular applications.

14. The IC device of claim 13, wherein the second antenna is configured for multi-band applications.

15. An integrated circuit (IC) device, comprising:
    a substrate having first and second opposing surfaces;
    an IC die coupled to the first surface of the substrate;
    a plurality of contact members coupled to the first surface of the substrate; and
    a metallic layer having a plurality of contact elements attached to a first surface thereof, the plurality of contact elements being coupled to respective ones of the plurality of contact members, the metallic layer being configured to provide heat spreading and electromagnetic interference shielding for the IC device.

16. The IC device of claim 15, further comprising:
    a mold compound disposed between the first surface of the substrate and the first surface of the metallic layer such that a surface of each of the plurality of contact members is substantially flush with the surface of the mold compound, wherein the mold compound encases the IC die.

17. The IC device of claim 15, wherein the metallic layer is coupled to a ground potential through at least one of the plurality of contact elements.

18. The IC device of claim 17, wherein the metallic layer is larger in at least one dimension than the substrate.

19. The IC device of claim 17, wherein the metallic layer is smaller in at least one dimension than the substrate.

20. The IC device of claim 15, wherein the plurality of contact elements comprise at least one of a molded solder ball, a conductor post, a solder cap, or a plated solder conductor post.

21. A method of assembling an integrated circuit (IC) device, comprising:
    coupling an IC die to a first surface of a substrate;
    coupling a plurality of contact members to the first surface of the substrate; and
    coupling a plurality of contact elements located on a first surface of an interposer to respective ones of the plurality of contact members, the interposer comprising first and second conductive layers separated by a dielectric layer, and an antenna formed using at least one of the first and second conductive layers, the antenna being electrically coupled to the IC die through at least one of the plurality of contact elements and at least one of the plurality of contact members.

22. The method of claim 21, further comprising:
disposing a mold compound on the first surface of the substrate such that a surface of each of the plurality of contact members is substantially flush with the surface of the mold compound, wherein the mold compound encases the IC die.

23. The method of claim 21, further comprising:
disposing a mold compound on the first surface of the substrate such that each of the plurality of contact members is partially exposed by the mold compound, wherein the mold compound encases the IC die.

24. A method of assembling an integrated circuit (IC) device, comprising:
coupling an IC die to a surface of a substrate;
coupling a plurality of contact members to the surface of the substrate; and
coupling a plurality of contact elements to respective ones of the plurality of contact members, wherein the plurality of contact elements is attached to a surface of a metallic layer and wherein the metallic layer is configured to spread heat from the IC device.

25. The method of claim 24, further comprising:
disposing a mold compound between the surface of the substrate and the surface of the metallic interposer; and
forming recessed openings in the mold compound above each of the plurality of contact members to enable electrical interconnection between respective ones of the plurality of contact elements and the plurality of contact members.

26. The method of claim 24, wherein the metallic layer is connected to a ground voltage through at least one of the plurality of contact members.

* * * * *

UNITED STATES PATENT AND TRADEMARK OFFICE
CERTIFICATE OF CORRECTION

PATENT NO.       : 8,718,550 B2           Page 1 of 1
APPLICATION NO.  : 13/247543
DATED            : May 6, 2014
INVENTOR(S)      : Zhao et al.

It is certified that error appears in the above-identified patent and that said Letters Patent is hereby corrected as shown below:

In the Claims

Column 11, line 38, claim 2, replace "IQ" with --IC--.

Signed and Sealed this
Twelfth Day of August, 2014

Michelle K. Lee
*Deputy Director of the United States Patent and Trademark Office*